United States Patent [19]

Yokoi et al.

[11] Patent Number: 4,692,694
[45] Date of Patent: Sep. 8, 1987

[54] LOAD TESTING APPARATUS FOR ELECTRONIC COMPONENTS

[75] Inventors: Satoru Yokoi; Hirokazu Kondo, both of Osaka, Japan

[73] Assignee: Tsubakimoto Chain Company, Osaka, Japan

[21] Appl. No.: 645,364

[22] Filed: Aug. 29, 1984

[30] Foreign Application Priority Data

Nov. 28, 1983 [JP] Japan .................. 58-182077[U]

[51] Int. Cl.⁴ .................................. G01R 31/02
[52] U.S. Cl. ...................... 324/158 F; 324/73 R
[58] Field of Search .......... 324/158 P, 158 F, 73 PC, 324/73 AT, 73 R; 414/222, 311, 150, 157, 187; 198/339.1, 859

[56] References Cited

U.S. PATENT DOCUMENTS

| | | | |
|---|---|---|---|
| 2,540,843 | 2/1951 | Stover | 324/73 AT |
| 2,773,731 | 11/1952 | Chick et al. | 324/158 F |
| 3,236,577 | 2/1966 | Anders et al. | 414/331 |
| 3,772,481 | 11/1973 | Saponaro | 324/158 F |
| 4,018,348 | 4/1977 | Bosshard | 414/287 |
| 4,145,620 | 3/1979 | Dice | 324/73 PC |
| 4,351,108 | 9/1982 | Johnson | 324/158 F |

FOREIGN PATENT DOCUMENTS 0101062 8/1980 Japan .................. 324/158 F

Primary Examiner—Reinhard J. Eisenzopf
Assistant Examiner—W. Burns
Attorney, Agent, or Firm—Armstrong, Nikaido, Marmelstein & Kubovcik

[57] ABSTRACT

Load tester for electronic components which has a plurality of shelves mounted on shelf frames movable in a horizontal circulation in an endless array entirely housed in a high temperature compartment. The drive mechanism for circulation is positioned outside of the compartment. Current is fed from an AC feed rail to individual rectifiers for each frame mounted outside of the compartment by individual current-collection trolleys. The current is then fed into the compartment to contact elements on each shelf.

4 Claims, 5 Drawing Figures

LOAD TESTING APPARATUS FOR ELECTRONIC COMPONENTS

BACKGROUND OF THE INVENTION:

The present invention relates to an apparatus for executing high-efficiency load tests on a multiplicity of electronic components over many hours in a high temperature environment while realizing a reduction in the space required for installation of testing equipment.

With the recent amazing diffusion of microcomputers in a variety of fields covering from factories to homes, there has arisen a severe requirement for high reliability of electronic components incorporated in such microcomputers. It is therefore essential to conduct strict inspection and load testing of the electronic components prior to incorporation thereof in the microcomputers. Considering an infinite variety of circumstances under which the computers are used, the load test needs to be executed for several or more hours continuously in a high temperature environment.

However, in the conventional load testing apparatus known heretofore, there are existent the following disadvantages:

(1) Batch type load testing apparatus

A load test for electronic components such as printed circuit boards is carried out by first inserting them in magazine racks, then carrying the racks into a load testing thermostatic room at 40° C. or so by an operator either manually or with the aid of an auxiliary device, and subsequently energizing the components for a predetermined period of time.

In such a testing apparatus, raising the room temperature further than 40° C. or so is not permitted so as to avoid deterioration of the working environment for the operator. The load test extending over many hours causes harmful influence to the operator's health. Furthermore, it is impossible to achieve fast progress in handling a large amount of electronic components using such an apparatus.

(2) Conveyor type load testing apparatus

This type executes a load test by inserting electronic components in magazine racks and, with storage transport thereof into a thermostatic room, energizing the components from a current collector located below the magazine racks. In such arrangement where a conveyor driving mechanism, a storage transport mechanism and so forth are subjected to the high temperature in the load testing thermostatic room, it is unavoidable that the reliability of the apparatus function is reduced with deterioration of the maintainability. Consequently, this type of apparatus is considered to be unsuitable for use under high-temperature testing condition. Furthermore, there occurs sparking due to momentary current interruption between the current collector and the joint of pallets having the magazine racks mounted thereon, hence inducing failure in attaining stable current conduction. In addition, since the flowing state of air enveloping the electronic components in the magazine rack at a standstill is different from that enveloping the components in any other magazine rack in motion, a difference is caused between the surface temperature distributions due to the heat generated from the electronic components. Consequently, it is impossible to retain a uniform surface temperature distribution of all of the components under control.

(3) Stationary shelf type load testing apparatus

In this apparatus, stationary shelves are installed in a high temperature room, and magazine racks with electronic components inserted therein are carried into and out of such room by means of a stacker crane. However, in the stage of transferring the magazine racks onto the shelves, it is necessary to perform an operation of switching on and off the power supply between the magazine racks and the shelves. Moreover, driving the stacker crane in a high temperature room brings about reduction in the reliability of the apparatus with deterioration of the maintainability due to the harmful effect that results from such high temperature. Furthermore, when an unbalanced state is induced with respect to the distribution of the magazine-mounted components above shelves and the non-mounted ones, there occurs a difference in the states of circulation of high temperature air, hence causing difficulties in making the temperature uniform throughout the thermostatic room. As a result, a satisfactory load test is not achievable for all of the electronic components under uniform temperature conditions.

In view of such circumstances, the present invention has been accomplished with elimination of the above-mentioned disadvantages observed in the conventional load testing apparatus. Hereinafter the invention will be described in detail with reference to the accompanying drawings.

DETAILED DESCRIPTION OF A PREFERRED EMBODIMENT

Figure 1:
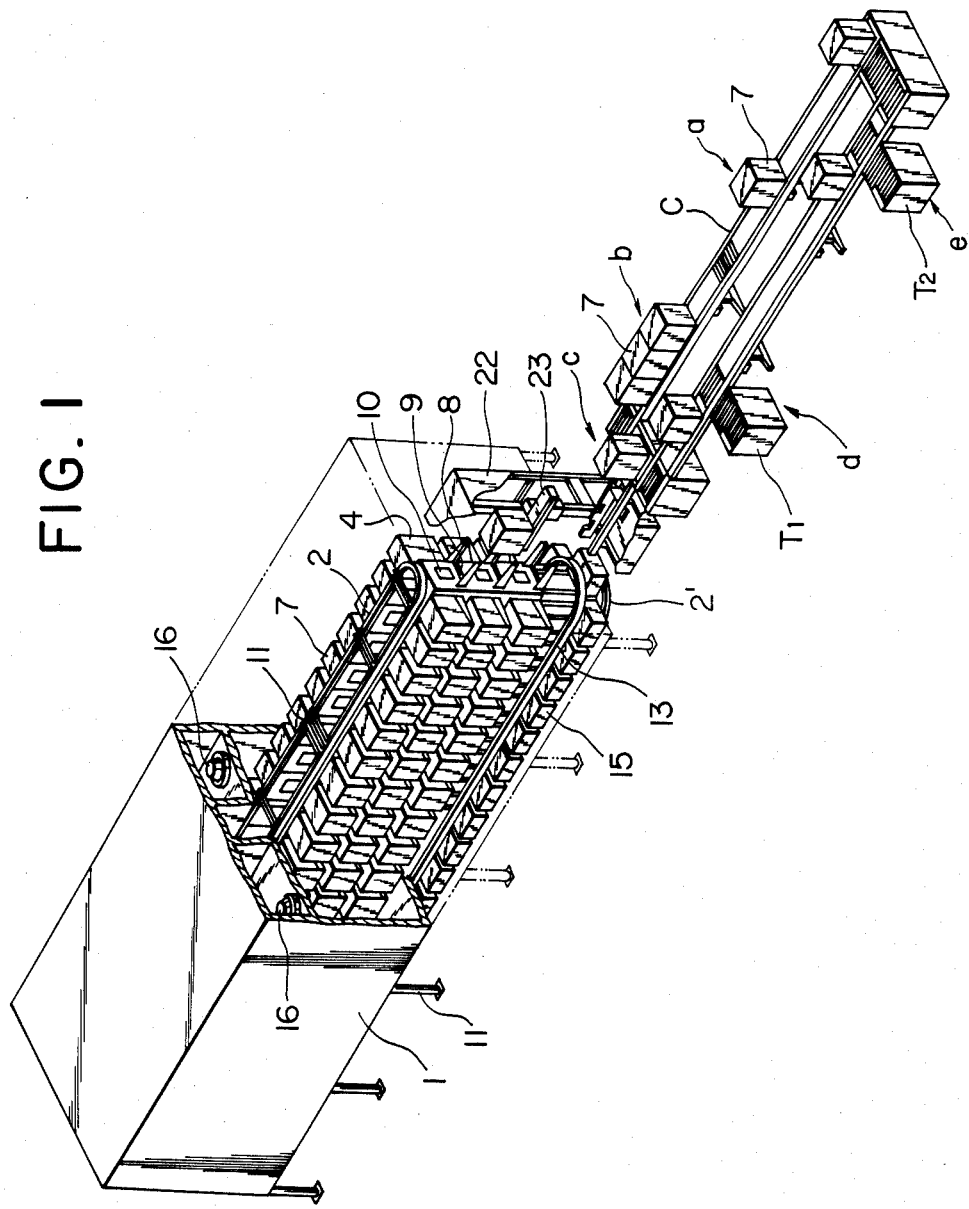
FIG. 1 is a partially cutaway perspective view of an electrical load testing apparatus embodying the present invention.
Figure 2:
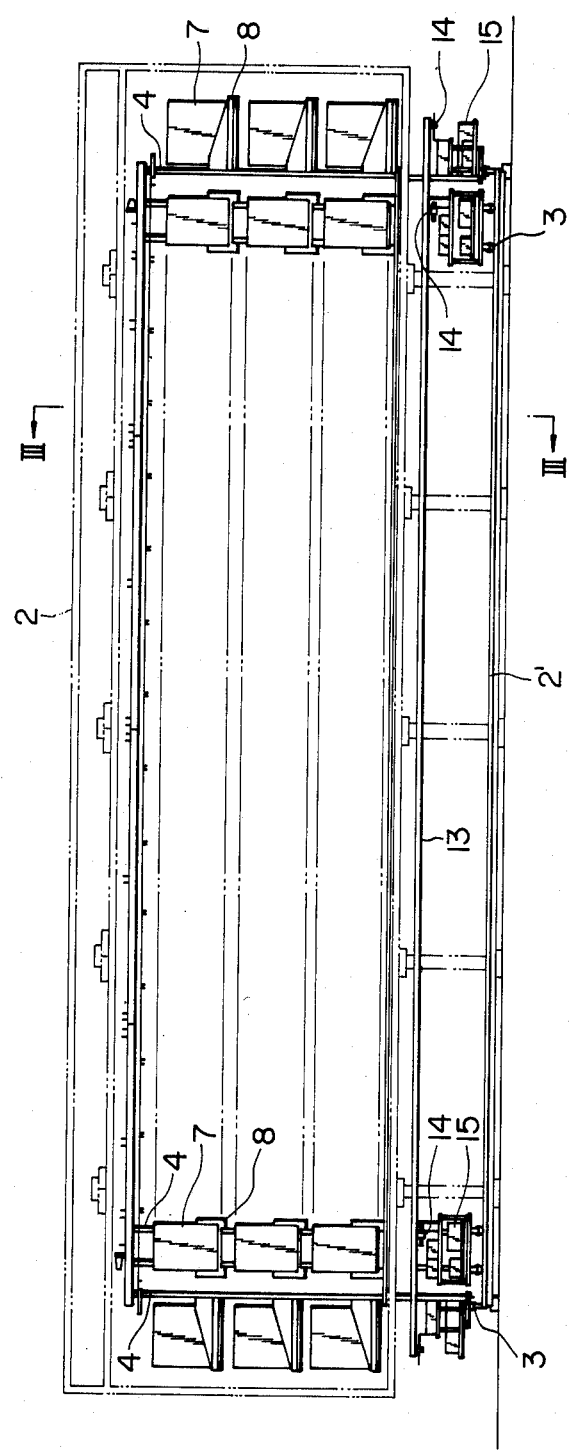
FIG. 2 is a front view of the shelf groups employed in the apparatus of FIG. 1.
Figure 3:
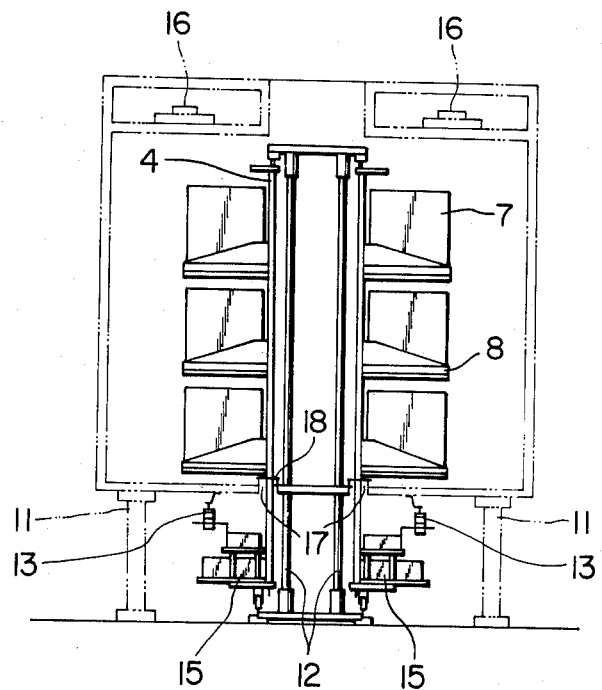
FIG. 3 is a sectional view taken along the line III—III in FIG. 2.

FIG. 1 is a partially sectional perspective view of an apparatus embodying this invention, wherein an upper guide rail 2 in the shape of a horizontal endless ring is disposed in a high temperature compartment 1 for executing a load test of electronic components for many hours under high temperature conditions. A lower guide rail 2' is disposed outside of the high temperature compartment coaxially with the upper guide rail 2. Vertical shelf frames 4 with wheels (FIG. 4) rollable on the guide rails 2 and 2' are arrayed in multiple rows and are connected with one another in an interlocked state. The frames 4 rotate in a horizontally endless manner through engagement of a driving sprocket 6 (FIG. 4) with driving pins 5 (FIG. 4) which extend downwardly from the lower ends of the frames 4 located outside of the high temperature compartment 1.

The frames 4 are equipped with multiple layers of forked shelves 8 which are adapted for mounting magazine racks 7 with multiple electronic components inserted therein. Each shelf 8 has a contact element 9 for feeding direct current to each of the multiple electronic components inserted in the magazine racks 7. A ventilating window 10 is formed behind each shelf 8.

The high temperature compartment 1 and the guide rails 2 and 2' are supported by a plurality of posts 11 and 12 standing upright on the floor. An AC feed rail 13 connected to an AC power supply is attached to the lower surface of the bottom plate of the high temperature compartment 1 along the horizontal rotation path of the shelf frames 4. A rectifier 15 having a current collecting trolley 14 movable through slide contact on the feed rail 13 is provided in a portion of each shelf frame 4 outside of the high temperature compartment 1. Direct current obtained through conversion of alternating current by the rectifier 15 is fed via a cable 15' to the contact element 9 secured to each shelf 8.

The high temperature compartment 1 is equipped with, in its upper area, an air conditioner 16 including a heat exchanger and a circulator, so as to make uniform the temperature distribution in the compartment 1 while keeping the temperature constant.

Figure 4:
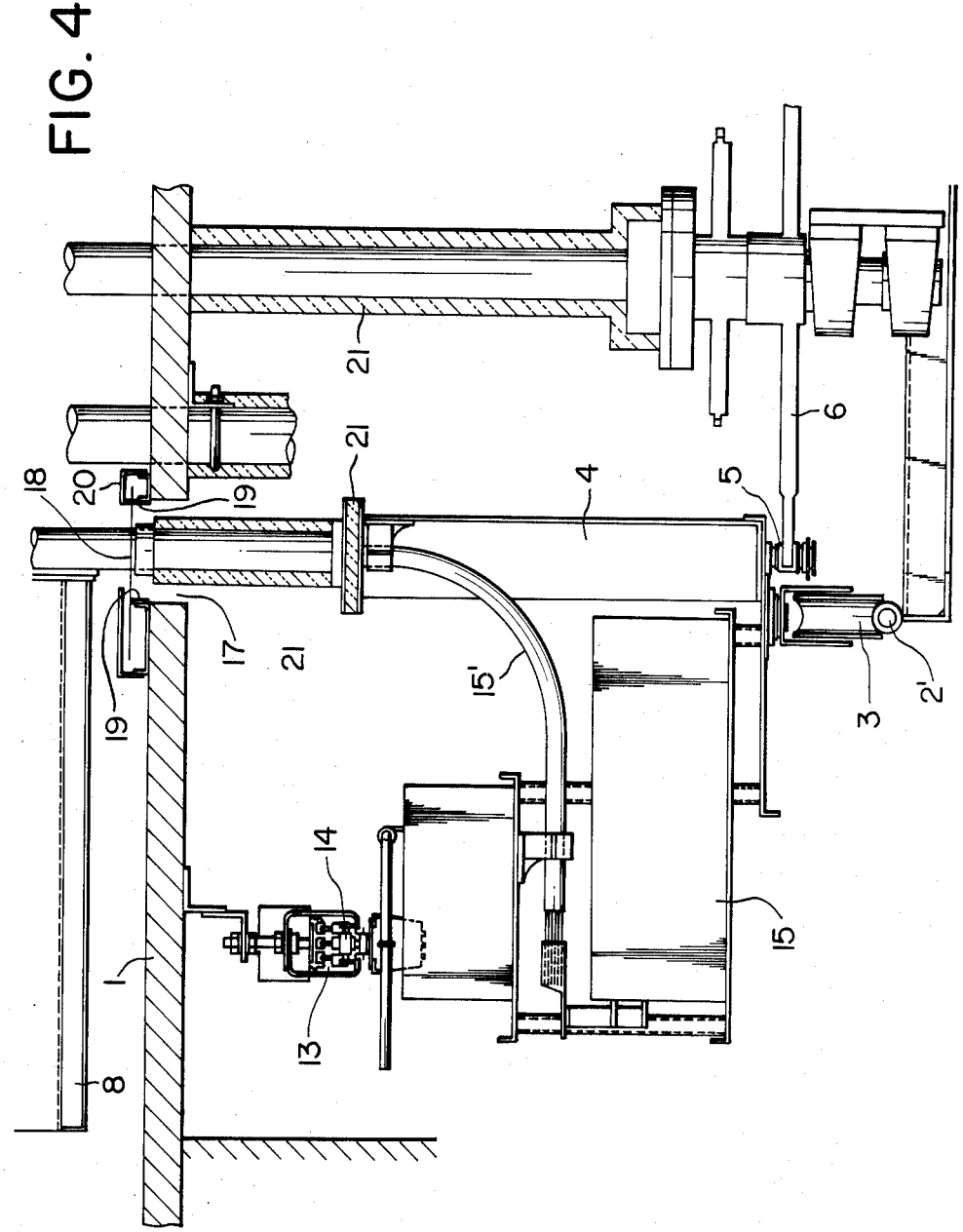
FIG. 4 is an enlarged side view illustrating principal portions of a shelf frame and its immediate vicinity below a high temperature compartment.

Therefore, as illustrated in FIG. 4, a heat shield plate 18 is provided in the vicinity of a gap 17 which is formed between the stationary high temperature compartment 1 and the shelf frames 4 with multiple shelves 8 circulating along the horizontal endless path in the compartment 1. In the vicinity of the gap 17, there are also provided a seal member 19 kept in slide contact with the heat shelf plate 18 and a cover plate 20 surrounding the two sides of the heat shield plate 18, so as to prevent harmful influence which may otherwise be caused in the compartment 1 by external heat and exerted adversely to the oepration of retaining the at a transfer position opposed to the transfer chamber 22, the magazine rack held at the standby position b is forwarded, in response to a known detection signal, up to a door position c in the transfer chamber 2 and simultaneously the door is opened. Since a transfer lifter 23 provided in the transfer chamber 22 is set ready at the lowermost position, the magazine rack is placed on the transfer lifter 23 and subsequently the door is closed.

The transfer lifter 23 carrying the magazine rack 7 thereon is moved upward to transfer the magazine rack 7 to the empty shelf and then is moved downward to be set at the lowermost position again. The same action as the above is repeated in accordance with each opening of the door, thereby transferring the magazine racks 7 sequentially to empty shelves.

The magazine racks 7 thus transferred to the empty shelves are brought into contact with the contact elements 9 as mentioned previously, and direct current is applied to the entire electronic components in the magazine racks simultaneously.

When any magazine rack 7 holding therein the electronic components already tested arrives at the transfer position in the chamber 22 with horizontal endless rotation in the high temperature compartment 1, the magazine rack is taken out of the transfer chamber through the door in a procedure reverse to the foregoing one executed for supplying the magazine rack. An inspection is carried out at a position d or e in an inspection station T1 or T2. The load-tested electronic components are taken out of the magazine rack 7 at the entrance position a, and new electronic components are inserted in the magazine rack.

As described hereinabove, supply and return of the magazine racks into and from the high temperature compartment 1 are executed properly with opening and closing of the heat shielded door located at the inlet-outlet aperture of the transfer chamber in such a manner as not to induce any impediment to the operation of retaining the compartment temperature constant and uniform. A multiplicity of electronic components placed in an electrically conducting state on the shelves arrayed in multiple rows and layers are heated uniformly with high temperature air which is circulated by the air conditioner 16 in the high temperature compartment 1 via the respective ventilating windows 10 formed in the shelves. The frames 4 and the bottom plate of the high temperature compartment 1 are thermally isolated from external heat due to the existence of the seal member 19 and so forth, whereby conduction of any external heat is prevented. Further, in combination with the heat insulator 21 and the like emloyed to check thermal conduction from the outside, the compartment temperature is maintained constant so that the load test of the electronic components circulated endlessly in such compartment can be executed uniformly for many hours under the satisfactory high temperature condition.

If electronic components to be exchanged are mounted on or demounted from the rotary shelves in an energized state, the contact elements are worn due to rush current or spark discharge caused at the time of current interruption. Therefore, it is necesary to halt the power supply to the electronic components when exchanging them. In order to prevent wear of the contact element 9 of the shelf and the current conducting terminal of the magazine rack 7 that is induced by an electrical discharge generated therebetween at the time of transferring the magazine rack onto or from the shelf, a predetermined region of the AC feed rail 13 at the magazine-rack transfer position of the shelf 8 may be so connected as to be energized or deenergized by turning on or off a magnet switch or the like. In this arrangement, the magnet switch is automatically turned on or off as the transfer lifter 23 is moved away from or toward the shelf 8. Consequently, when mounting the magazine rack 7 on or demounting the same from the shelf 8 by the transfer lifter 23, no current is applied to the predetermined region of the AC feed rail 13 at the magazine-rack transfer position, thereby generating no electrical discharge at all between the terminal of the magazine rack and the contact element of the shelf. Thus, it becomes possible to prevent wear that may otherwise be induced by the discharge between the rack terminal and the contact element.

Figure 5:
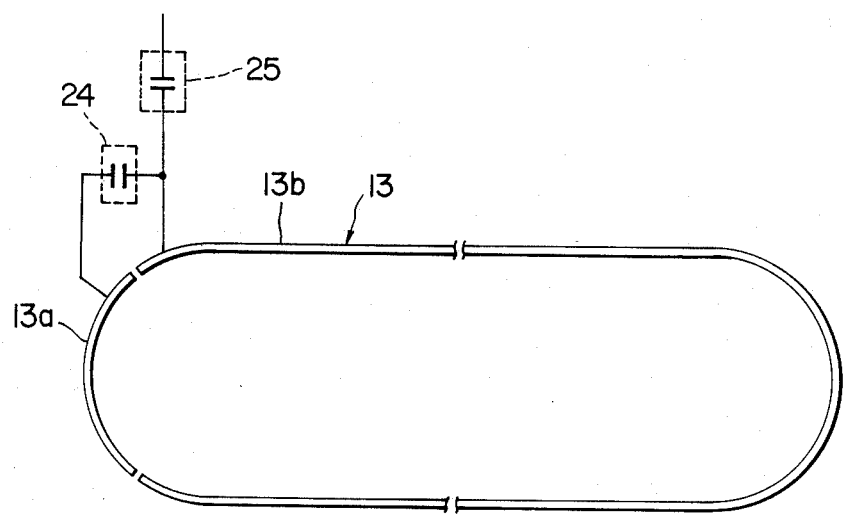
FIG. 5 is a plan view of a current feed rail with a feed control circuit diagram.

Referring now to an exemplary circuit configuration contrived for the purpose mentioned above, as illustrated in FIG. 5, at least two phases of a portion 13a of the AC feed rail 13 corresponding to the transfer position are insulated from the other portion 13b thereof, and the contact of a magnet switch 24 is interposed between the two portions 13a and 13b while the latter portion 13b is connected to the AC power supply via the contact of a magnet switch 25. This switch 25 is actuated simultaneously with initiation of a load test and feeds alternating current to the rail 13. The switch 24 is actuated in response to a signal representing the opening of the aforesaid door or in response to a signal representing the arrival of the magazine rack 7 at the door position c and executes a control action in such a manner as not to energize the rail portion 13a during the transfer of the magazine rack 7. Therefore, it is possible to employ any of suitable known control circuits that actuates the switch 24 by means of a limit switch or the like turned on during the closing of the door.

According to the present invention of the constitution described, the high temperature compartment to perform a load test for electronic components is internally maintained in satisfactory condition including a uniform temperature distribution without any fluctuation and is kept free from harmful influence of external heat. The testing temperature is further kept uniform by horizontal endless circulation of the shelf groups arrayed in multiple rows and layers, thereby facilitating heat control and enabling a load test for a large amount of electronic components in a limited narrow space with extremely low velocity transport for many hours. Furthermore, since the AC-converted direct current is fed to the electronic components on the individual shelves, there occurs neither momentary interruption of energization nor voltage drop, hence achieving stable application of the load voltage to enhance the load test performance. And when supplying or returning magazine racks to or from the shelves, the contact elements provided on the shelves are deenergized by the magnet switch actuated in response to approach of the transfer lifter and prevent generation of electrical discharge that may otherwise be caused between the contact elements and the magazine rack terminals. This eliminates any discharge-induced wear thereof and increases the durability as a result. Thus, although the computer has been considered weak against temperature-fluctuating environment, the present invention realizes a satisfactory load test for electronic components, which are to be incorporated in such computer, under high temperature condition for many hours. It follows, therefore, that the reliability of computerized equipment is enhanced to offer remarkable advantages.

In addition to the aforesaid exemplary embodiment where a plurality of shelves are attached in many layers to one shelf frame, it is a matter of course that a single shelf may be attached to one frame. In another modification, a plurality of frames may be arrayed in multiple vertical layers, and the frames in the individual layers may be driven independently of one another with horizontal rotation in either the same direction or mutually opposite directions. And it is to be understood that the present invention includes the entirety of such modifications.

What is claimed is:

1. A load testing apparatus for testing electronic components by applying direct current power at high temperatures, said apparatus comprising:
   a heated load testing high temperature compartment;
   an upper annular guide rail associated with said compartment and disposed inside of said compartment;
   a lower guide rail generally parallel to said upper guide rail, said lower guide rail disposed outside of said compartment;
   a plurality of shelf frames connected with one another in an endless array movably mounted on said guide rails and each shelf frame being disposed generally within said compartment and having an extended portion extending outside of said compartment, and each shelf frame having a wheel outside of said compartment and engageable with said lower guide rail for supporting said shelf frame for movement therealong;
   a plurality of shelves mounted on each shelf frame, each shelf receiving a plurality of the electronic components therein;
   contact elements on each shelf for feeding direct current to electronic components therein;
   a power rail disposed outside of said compartment and being generally parallel with a path of travel of said shelf frames; and
   means slidable along said power rail for transmitting power from said power rail to the contact elements of each of said plurality of shelves.

2. The load testing apparatus of claim 1, further comprising:
   driving means for horizontally circulating said frames within said compartment, said driving means being provided outside of said compartment and having heat shield means and seal means for preventing escape of heat from said compartment,
   an air conditioning means in said compartment for keeping the temperature therein constant,
   ventilating windows formed in each frame behind each shelf,
   a heat shield door disposed at a component inlet-outlet aperture of said compartment, and wherein said power transmitting means includes at least a current collecting trolley slidable along said power rail and a cable operatively connected to said trolley for transmitting power therefrom to said contact elements.

3. A load testing apparatus for testing electronic components by applying direct current power at high temperatures, said apparatus comprising:
   a high temperature compartment,
   a plurality of shelf frames connected with one another in a multiple-row endless arrangement, said shelf frames being disposed generally in said compartment, but with extended portions extending outside of said compartment,
   a plurality of shelves mounted in multiple layers on said frames, said shelves being contained entirely in said compartment, and each shelf receiving a plurality of the electronic components therein,
   contact elements on each shelf for feeing direct current to the electronic components therein,
   driving means operatively connected to the extended portions of each of said shelf frames for horizontally circulating said frames within said compartment, said driving means being provided outside of said compartment, an AC feed rail disposed outside of said compartment, a plurality of rectifiers positioned outside of said compartment, each rectifier being fixed to and movable with the extended portion of each of said shelf frames, each rectifier being electrically connected by cable means to said contact elements on the shelves of a corresponding shelf frame for proving direct current thereto and having a current-collecting trolley in slide contact with said AC feed fail for receiving AC power.

4. A current feed device for use in an electrical load testing apparatus having a high temperature compartment for testing electrical components therein by applying a direct current thereto, said device comprising:

multiple vertical layers of shelves for mounting thereon electrical components to be tested, each shelf having contact elements for feeding a current to said components thereon, said shelves and contact elements being disposed on each of a multiplicity of shelf frames connected with one another in an endless arangement and movable with horizontal circulation in the load-testing high temperature compartment each of said shelf frames having an extended portion outside of said high temperature compartment;

a plurality of rectifiers fixed to the extended portions of shelf frames outside of said high temperature compartment and each rectifier having a current collecting trolley in slidable contact with an AC feed rail, each of said rectifiers having a cable means for feeding a direct current to said contact elements; and switching means through which a current is fed to a region of said AC feed rail corresponding to a transfer position where the components to be tested are mounted on or demounted from said shelves, said switching means being automatically open-circuited at a time of mounting or demounting said components.

* * * * *